United States Patent [19]
Chen

[11] Patent Number: 5,844,257
[45] Date of Patent: Dec. 1, 1998

[54] MULTI-DIRECTIONAL LIGHT EMITTING SEMICONDUCTOR DEVICE

[75] Inventor: Tony K. T. Chen, Ping-Chen, Taiwan

[73] Assignee: Quarton, Inc., Taiwan

[21] Appl. No.: 874,114

[22] Filed: Jun. 12, 1997

[51] Int. Cl.$^6$ .................................................. H01L 33/00
[52] U.S. Cl. ................................ 257/91; 257/98; 257/99; 257/81
[58] Field of Search ................................. 257/91, 93, 98, 257/99, 79, 81, 82

[56] References Cited

U.S. PATENT DOCUMENTS 5,156,999 10/1992 Lee ............................................ 257/82

*Primary Examiner*—Minh-Loan Tran
*Attorney, Agent, or Firm*—Raymond Sun

[57] ABSTRACT

A light-emitting semiconductor device is adapted to be electrically connected to a substrate. The semiconductor device includes a first conductor having a first and a second surface, a second conductor having a first and a second surface, and an isolation material separating the first and second conductors. A light emitting element is disposed on the first conductor. The semiconductor device further includes a first semiconductor surface having the first surfaces of the first and second conductors separated by the isolation material, and a second semiconductor surface having the second surfaces of the first and second conductors separated by the isolation material. Both the first semiconductor surface and the second semiconductor surface may be electrically connected to the substrate. The light emitting element emits a first light beam when the first semiconductor surface is connected to the substrate and the light emitting element emits a second light beam when the second semiconductor surface is connected to the substrate, with the first and second light beams having different directions and/or orientations.

18 Claims, 14 Drawing Sheets

5,844,257

MULTI-DIRECTIONAL LIGHT EMITTING SEMICONDUCTOR DEVICE

BACKGROUND OF THE INVENTION

1. Field of the Invention

The present invention relates to a multi-directional light emitting semiconductor device, and more particularly, to a light emitting semiconductor device having a light emitting element, such as a semiconductor laser element. The light emitting semiconductor device is configured to allow the semiconductor device to be coupled to a substrate in a variety of positions, each position allowing light to be emitted in a different direction or at a different orientation.

2. Description of the Prior Art

A conventional light emitting member A is illustrated in FIG. 1. The light emitting device A has a disk-shaped stem 11 made of metal, and a rectangular metal projecting portion 12 formed on a center of a surface of the stem 11. A light emitting element 13 represented by a semiconductor laser element or the like is mounted on a mounting of projecting portion 12 through a heat sink 14. A light receiving element 15, such as a photodiode, is also provided for monitoring the output of a ray emitted from the light emitting element 13 to control the output thereof. A metal cap 16 is mounted on the stem 11 to cover the elements 13 and 15. A pair of signal terminals 17a and 17b are mounted through the stem 11 in an insulated relationship to be electrically connected to light emitting element 13 and light receiving element 15 through wires 18. A ground terminal 17c is planted to stem 11 to be electrically connected thereto and further connected to elements 13 and 15.

A drawback of these conventional light emitting devices A is that the light emitted from these devices A is in a fixed direction. For example, when a semiconductor laser element is used for the light emitting element 13, the element 13 emits a laser beam that extends only in the upward direction through the window 19 as indicated by the arrow L. The device A cannot be made to emit a laser beam in another direction or at another orientation, unless the position and direction of the substrate to which it is coupled is also changed.

Thus, there still remains a need for a light emitting semiconductor device which overcomes the drawbacks of the prior art devices, and which allows the semiconductor device to be coupled to a substrate in a variety of positions, each position allowing light to be emitted in a different direction and/or at a different orientation.

SUMMARY OF THE DISCLOSURE

The objects of the present invention may be accomplished by providing a light-emitting semiconductor device that is adapted to be electrically connected to a substrate. The semiconductor device includes a first conductor having a first and a second surface, a second conductor having a first and a second surface, and an isolation material separating the first and second conductors. A light emitting element is disposed on the first conductor. The semiconductor device further includes a first semiconductor surface having the first surfaces of the first and second conductors separated by the isolation material, and a second semiconductor surface having the second surfaces of the first and second conductors separated by the isolation material. Both the first semiconductor surface and the second semiconductor surface may be electrically connected to the substrate. The light emitting element emits a first light beam when the first semiconductor surface is connected to the substrate and the light emitting element emits a second light beam when the second semiconductor surface is connected to the substrate, with the first and second light beams having different directions and/or orientations.

According to one embodiment of the present invention, the first and second conductors each includes a third surface, and the semiconductor device further includes a third semiconductor surface having the third surfaces of the first and second conductors separated by the isolation material. The light emitting element may be disposed on the third surface of the first conductor. The substrate includes an electrical connector for connecting one of the semiconductor surfaces to the substrate.

According to another embodiment of the present invention, the first semiconductor surface is adjacent to the second semiconductor surface, and the first, second and third semiconductor surfaces are adjacent to each other. The first surface of the first conductor has an L-shaped configuration, the second surface of the first and second conductors have elongated configurations, and the third surface of the first and second conductors have elongated configurations.

According to yet another embodiment of the present invention, the first semiconductor surface is opposite the second semiconductor surface, and the third semiconductor surface is adjacent the first and second semiconductor surfaces. The first, second and third surfaces of the first and second conductors have elongated configurations.

According to a further embodiment of the present invention, the light-emitting semiconductor device further includes a third conductor having first and second surfaces and a second isolation material. The first semiconductor surface includes the first surfaces of the first, second and third conductors separated by the isolation materials, and the second semiconductor surface includes the second surfaces of the first, second and third conductors separated by the isolation materials. The first semiconductor surface is adjacent to the second semiconductor surface. The second isolation material according to one embodiment includes a first dielectric material separating the first conductor and the second and third conductors, a second dielectric material separating the second and third conductors, and a third dielectric material separating the first and third conductors. The second isolation material according to another embodiment includes a first dielectric material separating the first and second conductors, and a second dielectric material separating the first and third conductors.

Thus, the semiconductor device according to the present invention provides a light emitting element that can emit light beams in two or more different directions or orientations, depending on the position at which the semiconductor device is connected to the substrate.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

Figure 2:
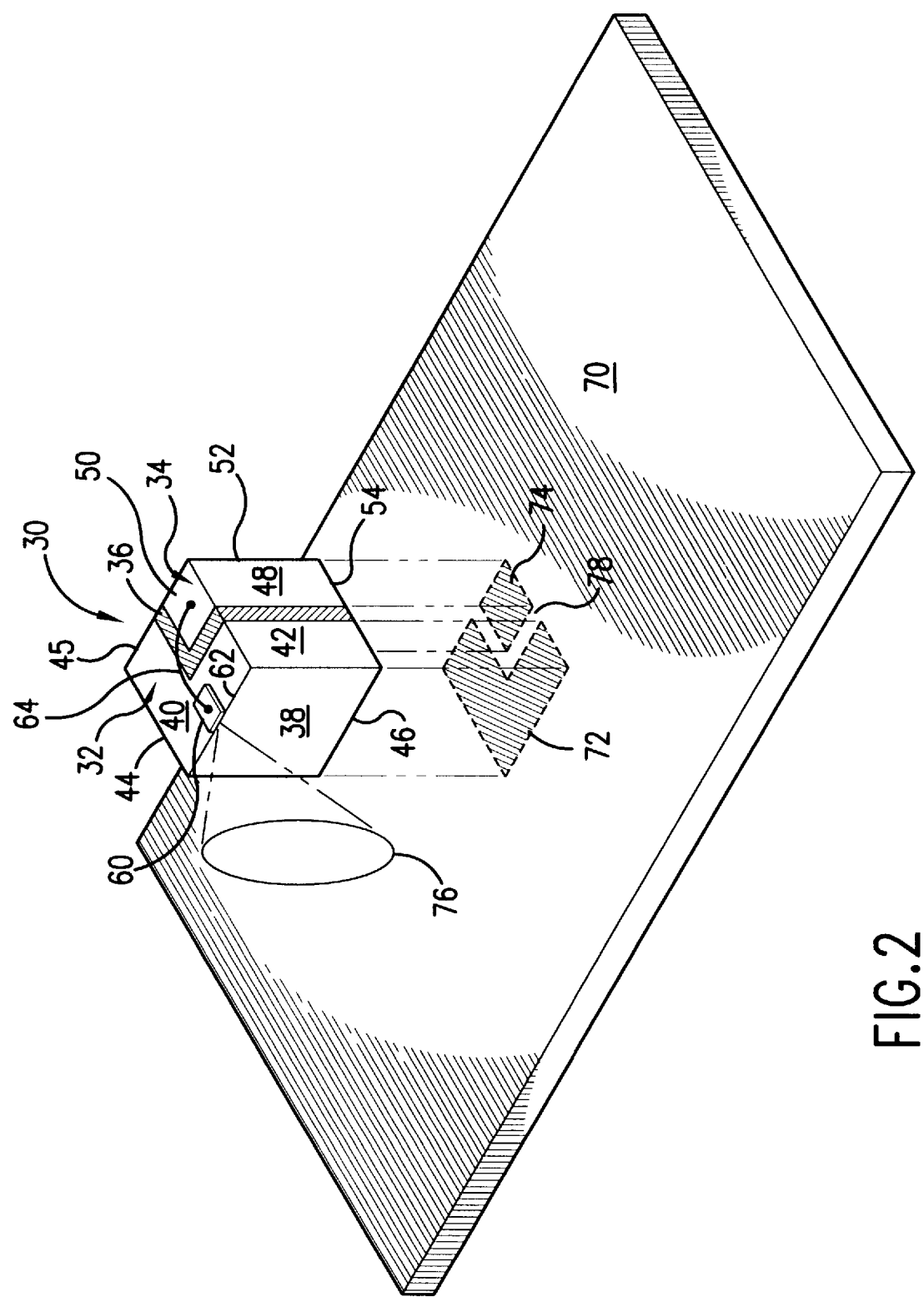
FIG. 2 is perspective view of a light emitting semiconductor device according to a first embodiment of the present invention shown in use with a substrate.
Figure 3:
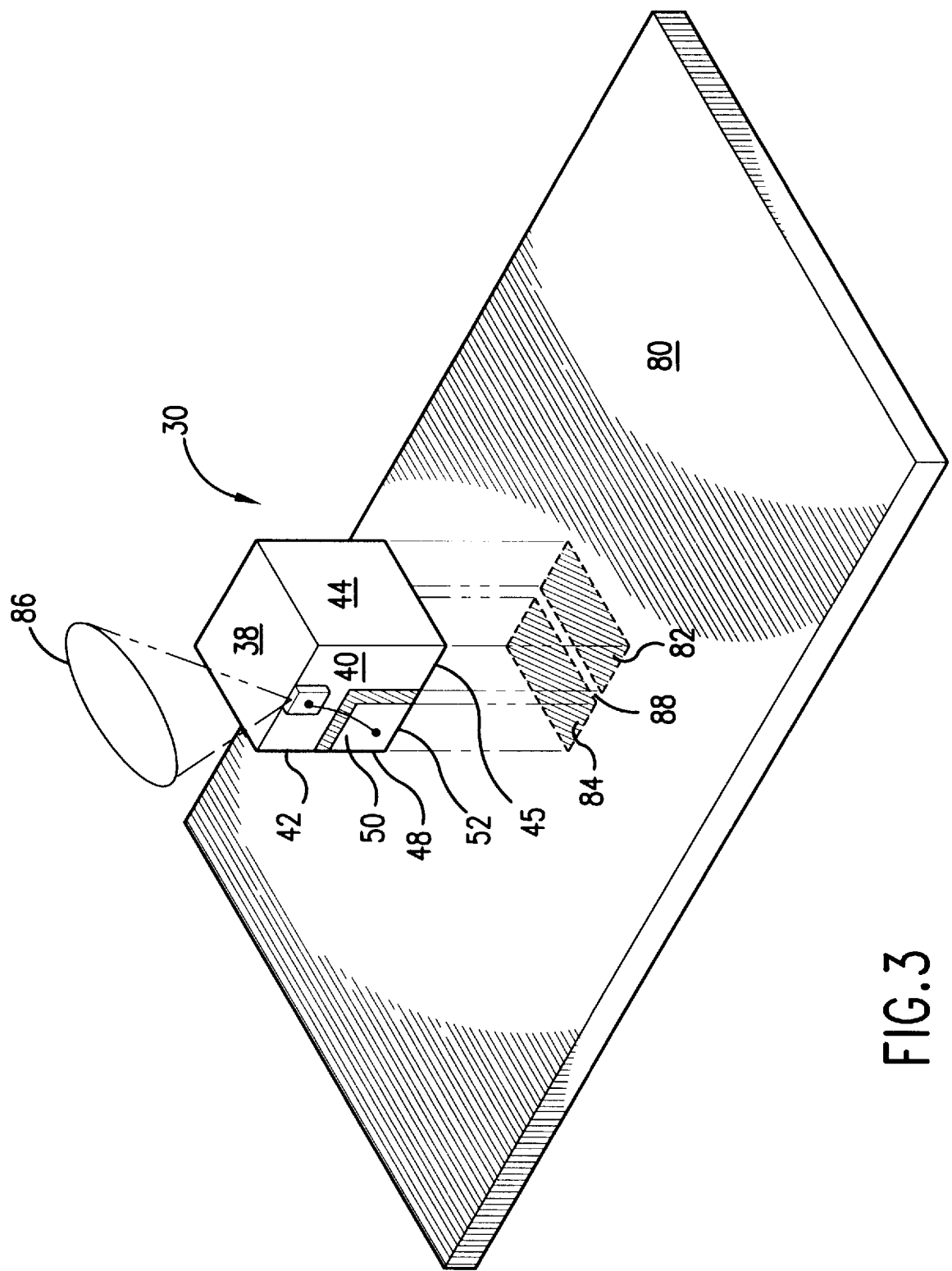
FIG. 3 is a perspective view of the device of FIG. 2 oriented at a different direction in use with another substrate.
Figure 4:
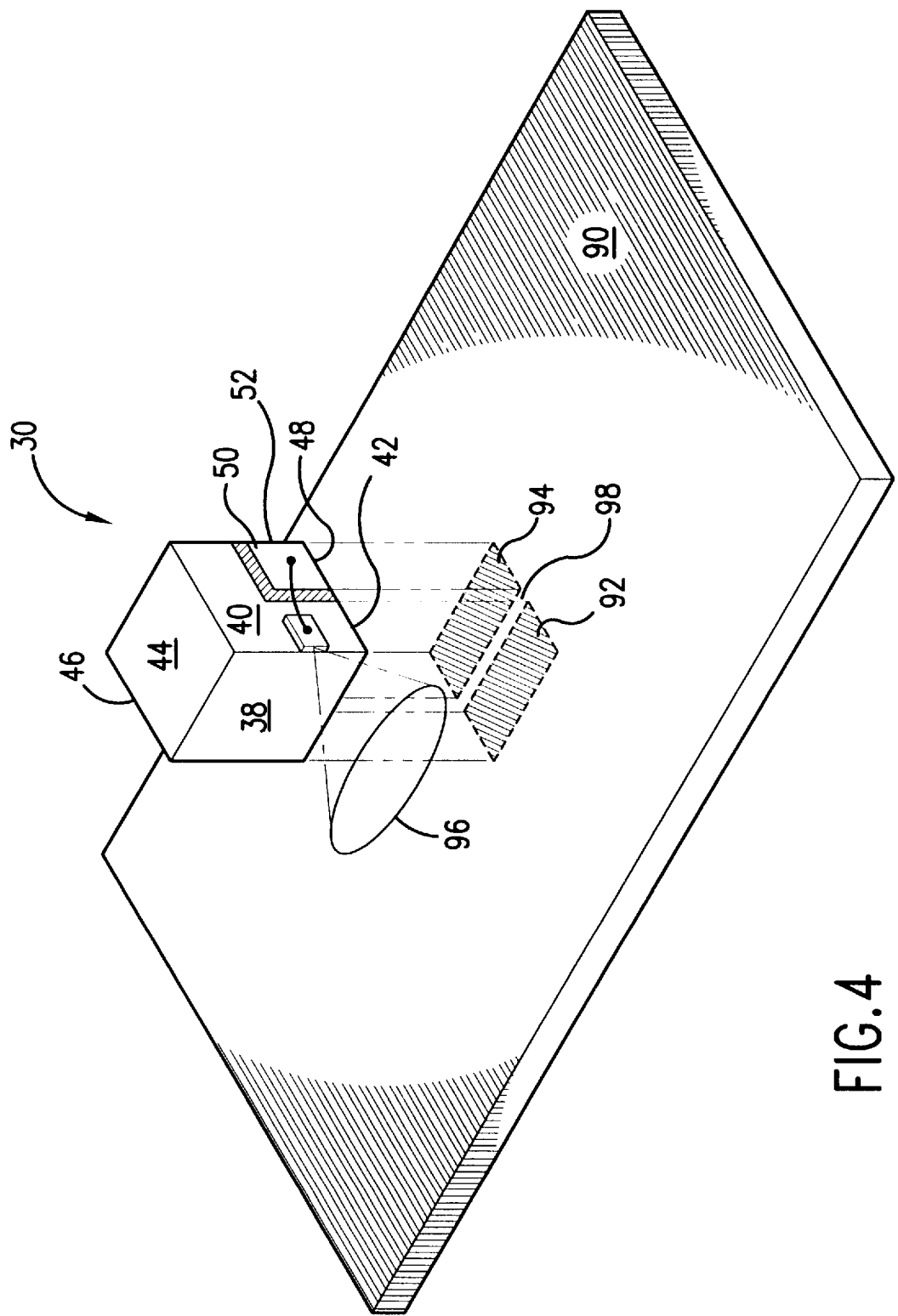
FIG. 4 is a perspective view of the device of FIG. 2 oriented at another different direction in use with yet another substrate.

FIGS. 2–4 illustrate a light emitting semiconductor device 30 according to a first embodiment of the present invention. The semiconductor device has two conductors 32 and 34 that are separated by an isolation mechanism 36, such as a dielectric material. The first conductor 32 and the dielectric material 36 both have generally L-shaped configurations. Specifically, the dielectric material 36 is a thin strip of material having an L-shaped configuration, and sandwiched between the L-shaped first conductor 32 and the second conductor 34, so that the semiconductor device 30 takes on a block configuration which in the preferred embodiment resembles a cube.

The semiconductor device 30 defines a number of surfaces. The top surface of the semiconductor device 30 is defined by an L-shaped first surface 40 of the first conductor 32 and a square or rectangular first surface 50 of the second conductor 34. The bottom surface of the semiconductor device 30 is defined by an L-shaped second surface 46 of the first conductor 32 and a square or rectangular second surface 54 of the second conductor 34. The semiconductor device 30 has four side surfaces that define the generally cubic configuration between and adjacent the top and bottom surfaces. These four side surfaces are defined by (1) a square or rectangular third surface 38 of the first conductor 32, (2) a square or rectangular fourth surface 44 of the first conductor 32 adjacent to the third surface 38 of the first conductor 32, (3) an elongated fifth surface 45 of the first conductor 32 (adjacent to the fourth surface 44 of the first conductor 32) and an elongated third surface 52 of the second conductor 34, and (4) an elongated sixth surface 42 of the first conductor 32 (adjacent the third surface 38 of the first conductor 32) and an elongated fourth surface 48 of the second conductor 34 (adjacent the third surface 52 of the second conductor 34). The dielectric material 36 separates the conductors 32 and 34 along (1) the top and bottom surfaces of the semiconductor device 30, (2) between the surfaces 42 and 48 of the first and second conductors 32, 34, respectively, and (3) between the surfaces 45 and 52 of the first and second conductors 32, 34, respectively.

The conductors 32 and 34 are preferably made from a conducting material, such as metals, including but not limited to copper, steel, iron, or aluminum, each combined with gold or aluminum plate, or any other conventional coatings known in the art. The conductors 32, 34 can have a dimension (i.e., width and/or length) ranging from about 1 mm to about 20 mm. The dielectric material 36 is preferably selected from known dielectric materials, including but not limited to glass, china, ceramic and plastic. The dielectric material 36 preferably has a thickness of about 2 microns to 2 mm. The block that makes up the semiconductor device 30 preferably has a size ranging from about 1 mm to about 20 mm in width and length.

A light emitting element 60 is disposed on the first surface 40 of the first conductor 32 adjacent the edge 62 between the first surface 40 and the third surface 38 of the first conductor 32. The light emitting element 60 is preferably disposed at a central portion of the edge 62, although those skilled in the art will appreciate that the light emitting element 60 can be positioned anywhere along the edge 62. Each such different position along the edge 62 would provide a different direction for the light beam emitted from the light emitting element 60. The light emitting element 60 is electrically connected to the second conductor 34 by a wire 64.

The light emitting element 60 is preferably a semiconductor laser diode. The light emitting element 60 is connected to the first surface 40 by one of a number of methods. According to a first non-limiting example, a thin strip of tin or gold-tin is applied between the surface 40 and the light emitting element 60. According to a second non-limiting example, a coating of indium, tin or gold-tin is applied between the surface 40 and the light emitting element 60. According to a third non-limiting example, a powder such as tin or gold-tin may be applied between the surface 40 and the light emitting element 60. In all three examples, the light-emitting element 60 is heat-bonded to the surface 40 after the application of the coating, strip of material or powder.

Referring now to FIG. 2, the semiconductor device 30 is positioned on substrate 70 in a manner such that the bottom surface of the semiconductor device 30 (i.e., second surfaces 46 and 54 of the first and second conductors 32, 34, respectively) is positioned against the substrate 70. Electrical connectors 72 and 74, such as conductor pads, are connected to the second surfaces 46 and 54, respectively. Connector 72 is generally L-shaped to match the L-shaped configuration of second surface 46 of L-shaped first conductor 32, while connector 74 is shaped either as a square or rectangle to match the shape of the second surface 54 of the second conductor 34. A generally L-shaped space 78 separates the connectors 72 and 74 on the substrate 70. When positioned in the manner shown in FIG. 2, the light emitting element 60 emits a beam of light 76 that extends to the left of the semiconductor device 30.

The pads 72 and 74 are preferably made of copper (if used with printed circuit board), and can include but is not limited to aluminum or nickel in combination with copper.

Figure 1:
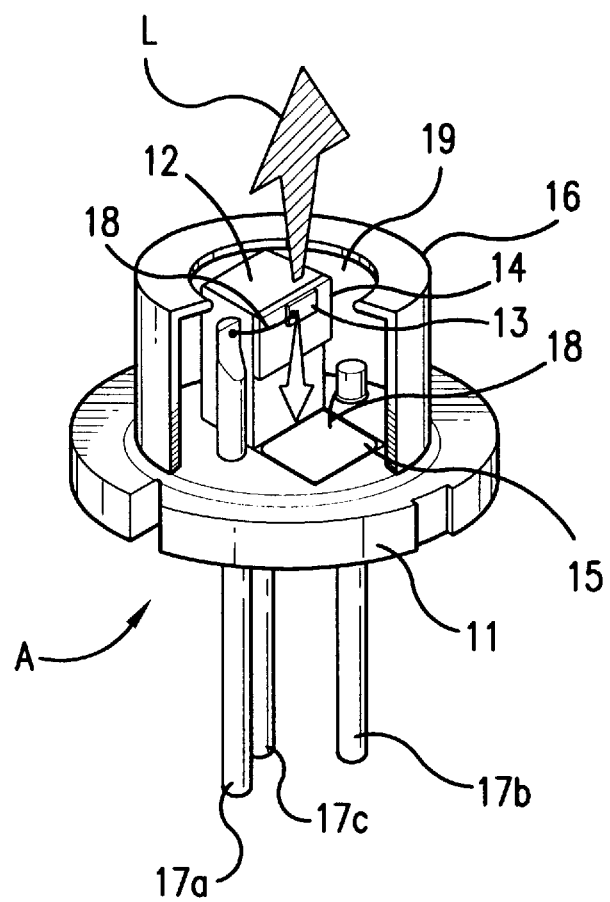
FIG. 1 is a perspective cut-away view of a conventional light emitting semiconductor device.
Figure 14:
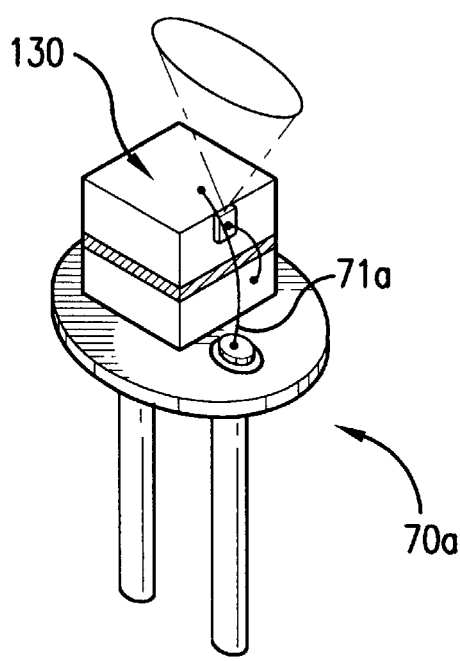
FIG. 14 is a perspective view of the device of FIG. 8 connected to stem.
Figure 15:
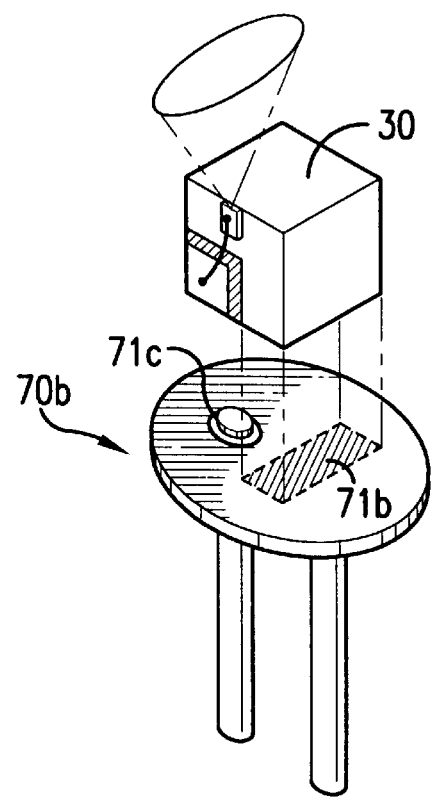
FIG. 15 is a perspective view of the device of FIG. 2 connected to another stem.

The substrate 70 may be a printed circuit board, or may be a stem, such as the stems 70a and 70b illustrated in FIGS. 14 and 15. The printed circuit board and stems are hereinafter referred to as "substrate". In FIG. 14, a semiconductor device 130 (which is described in detail below) has its separate conductors connected to a stem 70a by a pad (not shown) and a wire 71a. In FIG. 15, the semiconductor device 30 has its separate conductors connected to a stem 70b by a pad 71b and a pad 71c. It is easier to manufacture the combined stems and semiconductor devices of FIGS. 14 and 15 than to manufacture the light emitting element A shown in FIG. 1.

Referring now to FIG. 3, the semiconductor device 30 is positioned on a substrate 80 in a manner such that the fifth surface 45 of the first conductor 32 and the third surface 52 of the second conductor 34 are positioned against the substrate 80. Electrical connectors 82 and 84, such as conductor pads, are connected to the surfaces 45 and 52, respectively. Connectors 82 and 84 are elongated to match the elongated configuration of the surfaces 45 and 52. An elongated space 88 separates the connectors 82 and 84 on the substrate 80. When positioned in the manner shown in FIG. 3, the light emitting element 60 emits a beam of light 86 that extends upwardly from the semiconductor device 30.

Referring now to FIG. 4, the semiconductor device 30 is positioned on a substrate 90 in a manner such that the sixth surface 42 of the first conductor 32 and the fourth surface 48 of the second conductor 34 are positioned against the substrate 90. Electrical connectors 92 and 94, such as conductor pads, are connected to the surfaces 42 and 48, respectively. Connectors 92 and 94 are elongated to match the elongated configuration of the surfaces 42 and 48. An elongated space 98 separates the connectors 92 and 94 on the substrate 90. When positioned in the manner shown in FIG. 4, the light emitting element 60 emits a beam of light 96 that extends to the left of the semiconductor device 30, but at an orientation that is different from the light beam 76 in FIG. 2. The different orientation is created by the elliptical nature of the light beams, which has a long element and a short element. Light beams 76 and 96 may be directed at about the same direction, but their orientations are different because their respective long elements are directed along different axes. For example, the long element of light beam 76 is oriented along a generally vertical axis, while the long element of light beam 96 is oriented along a generally horizontal axis.

Figure 5:
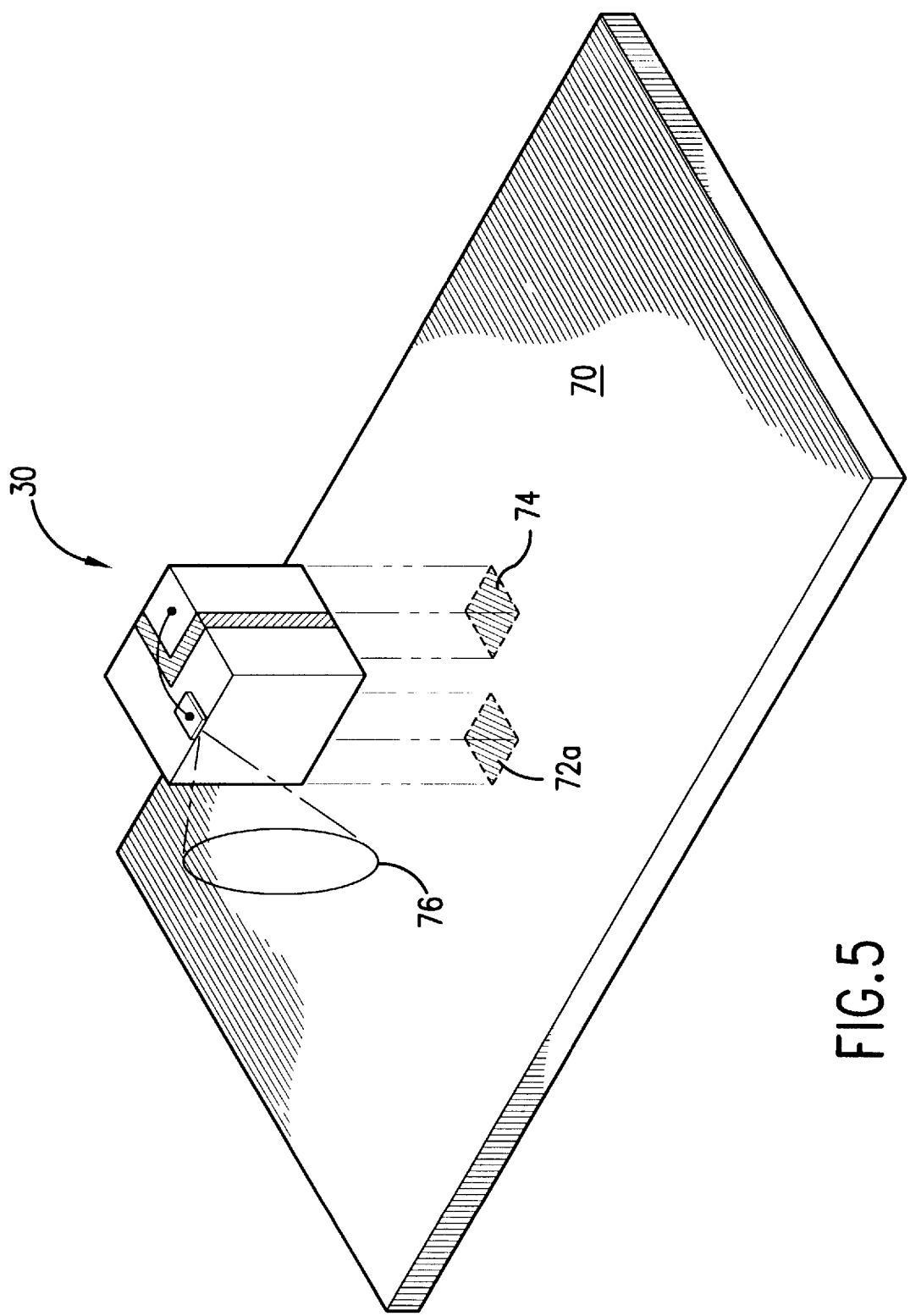
FIG. 5 is a perspective view of the device of FIG. 2 oriented at the direction of FIG. 2 but used with a different pair of connector pads.

FIG. 5 illustrates the semiconductor device 30 positioned on the substrate 70 in the same manner to produce a beam of light 76 that extends in the same direction and at the same orientation as the light beam 76 in FIG. 2. The only difference is that a smaller pad 72a is provided instead of the L-shaped pad 72. The pad 72a does not match the configuration and size of the L-shaped first surface 46.

Figure 6:
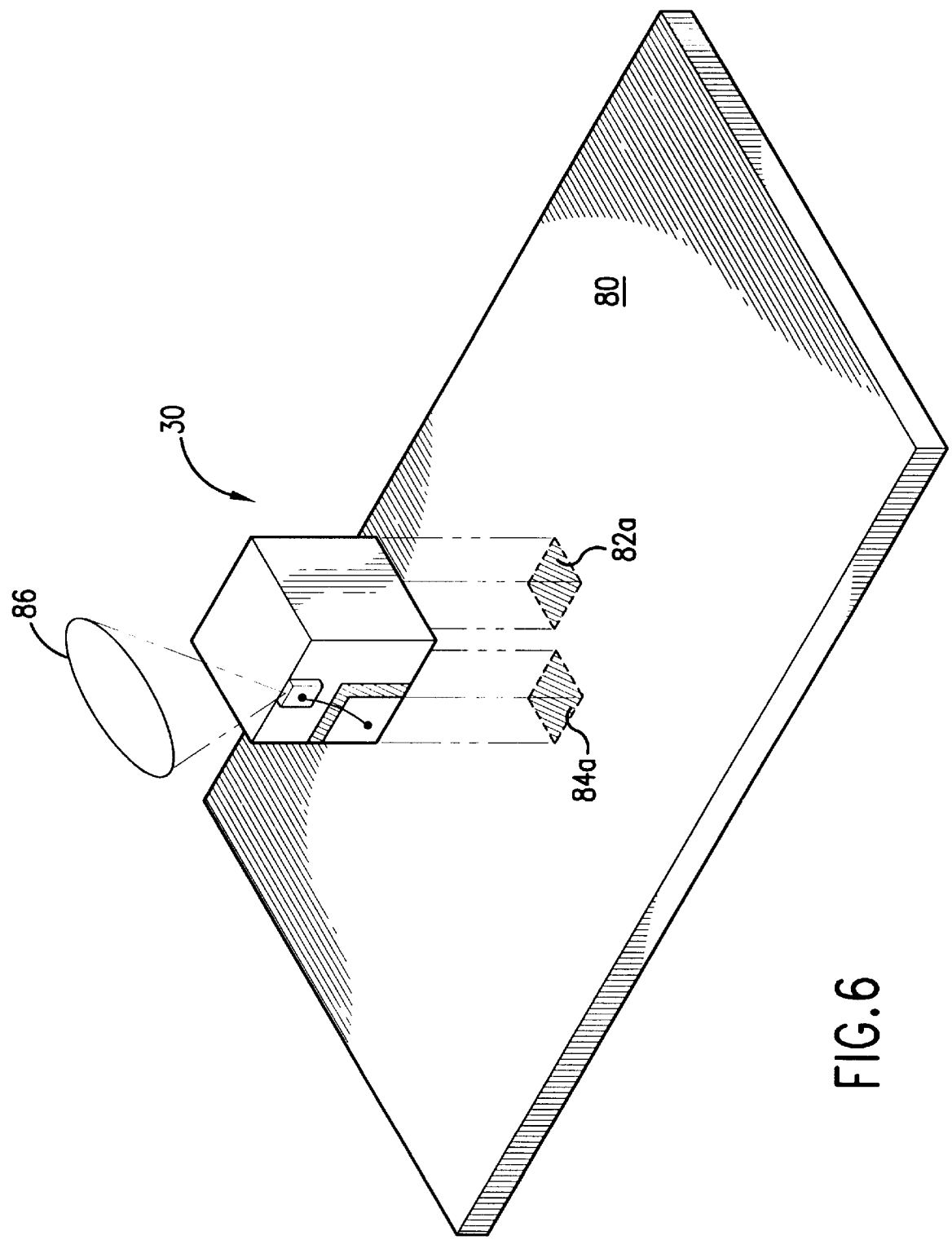
FIG. 6 a perspective view of the device of FIG. 2 oriented the direction of FIG. 3 but used with a different pair of connector pads.

Similarly, FIG. 6 illustrates the semiconductor device 30 positioned on the substrate 80 in the same manner to produce a beam of light 86 that extends in the same direction and at the same orientation as the light beam 86 in FIG. 3. Again, the only difference is that smaller pads 82a and 84a are provided at opposite corners of the semiconductor device 30 in place of the two elongated pads 82 and 84, respectively. The pads 82a and 84a do not match the configuration and size of the elongated surfaces 45 and 52, respectively, but are instead positioned at opposite corners of the semiconductor device 30.

Figure 7:
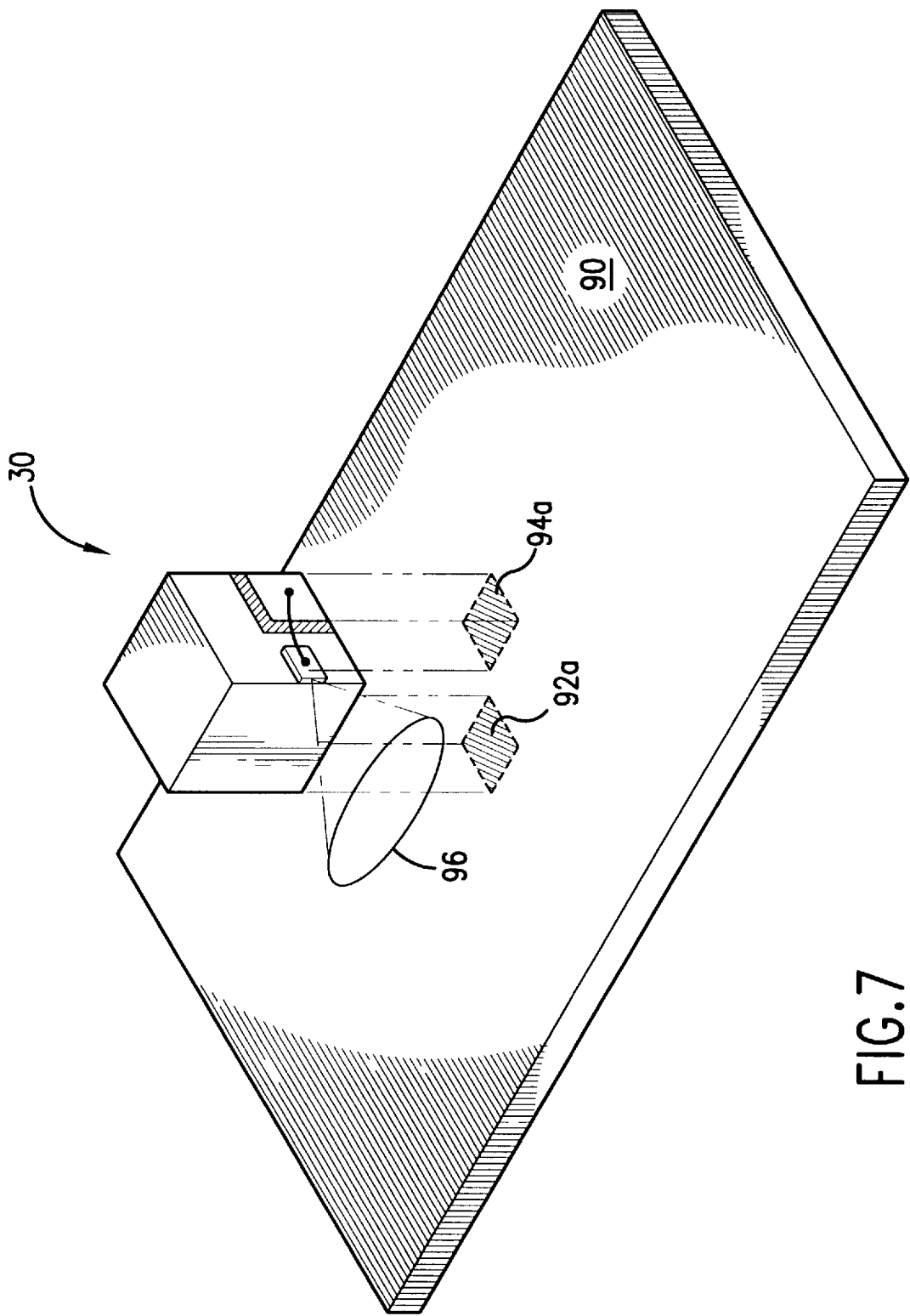
FIG. 7 is a perspective view of the device of FIG. 2 oriented at the direction of FIG. 4 but used with a different pair of connector pads.

FIG. 7 likewise illustrates the semiconductor device 30 positioned on the substrate 90 in the same manner to produce a beam of light 96 that extends in the same direction and at the same orientation as the light beam 96 in FIG. 4. Again, the only difference is that smaller pads 92a and 94a are provided at opposite corners of the semiconductor device 30 in place of the two elongated pads 92 and 94, respectively. The pads 92a and 94a do not match the configuration and size of the elongated surfaces 42 and 48, respectively, but are instead positioned at opposite corners of the semiconductor device 30.

Thus, the semiconductor device 30 provides a light emitting element 60 that can emit light beams in three different directions or orientations, depending on the position at which the semiconductor device 30 is connected to the substrate 70, 80 and 90. In effect, any surface of the semiconductor device 30 where the dielectric material 36 separates two surfaces, one surface from the first conductor 32 and one surface from the second conductor 34, can be electrically connected to the substrate. Of the six different surfaces of the semiconductor device 30, only three surfaces are not available for electrical connection to the substrate: side surfaces 38 and 44, and the top surface (made up of the first surfaces 40 and 50 of the first and second conductors 32 and 34, respectively) where the light emitting element 60 is disposed. The three surfaces that are available for electrical connection to the substrate have been illustrated in FIGS. 2–7.

It will noted from FIGS. 5–7 that the pads 72a, 84a and 92a can be the same pad. Similarly, pads 74, 82a and 94a can also be the same pad. Thus, substrates 70, 80 and 90 illustrated in FIGS. 5–7 can be the same substrate, so that only one substrate having two pads configured as illustrated in FIGS. 5–7 can be used to accomodate the semiconductor device 30 in any of its three illustrated positions. In addition, those skilled in the art will appreciate that different substrates having differently sized and configured connector pads can be provided in place of the substrates and pads described and illustrated in FIGS. 2–7.

Figure 8:
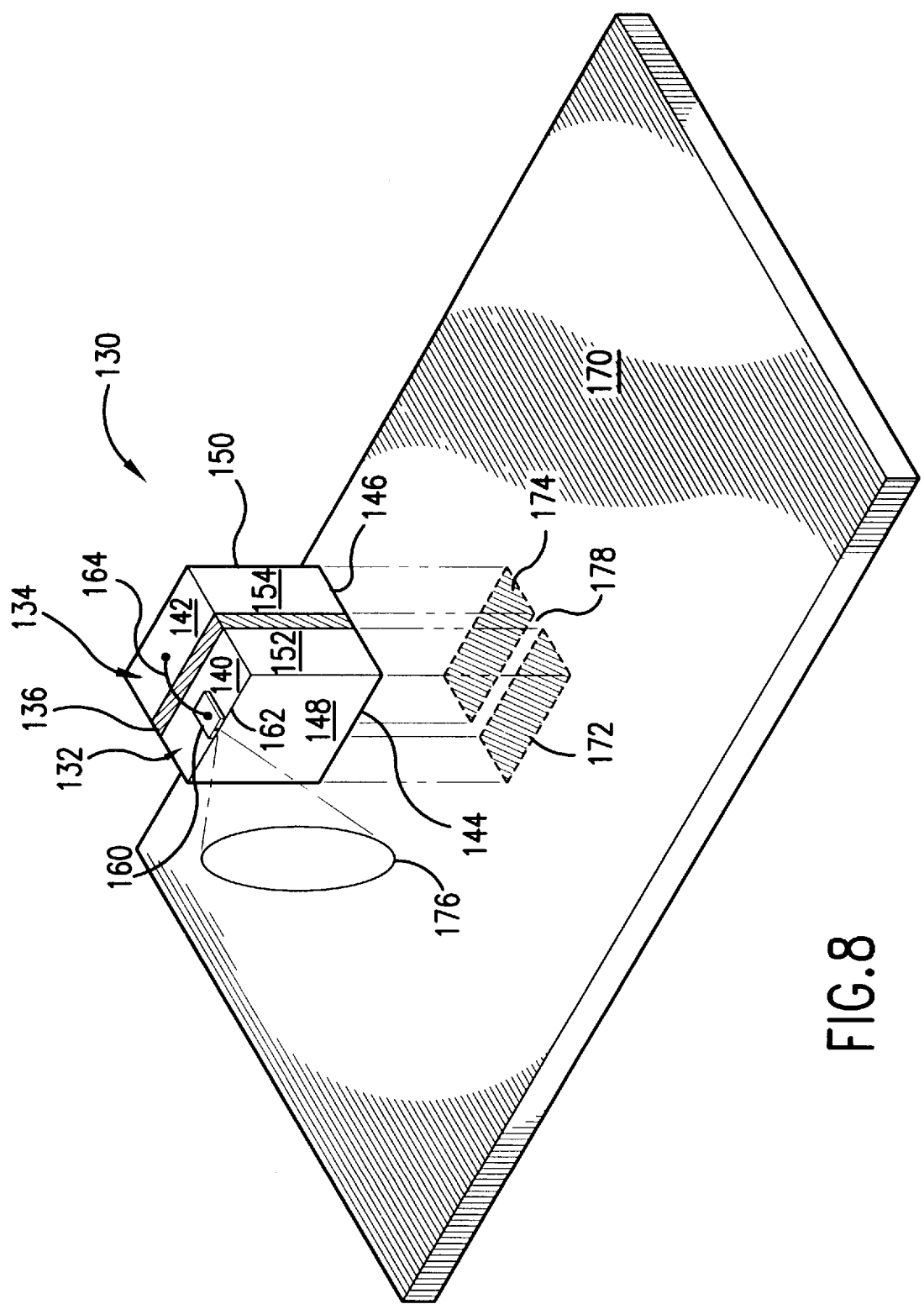
FIG. 8 is perspective view of a light emitting semiconductor device according to a second embodiment of the present invention shown in use with a substrate.
Figure 9:
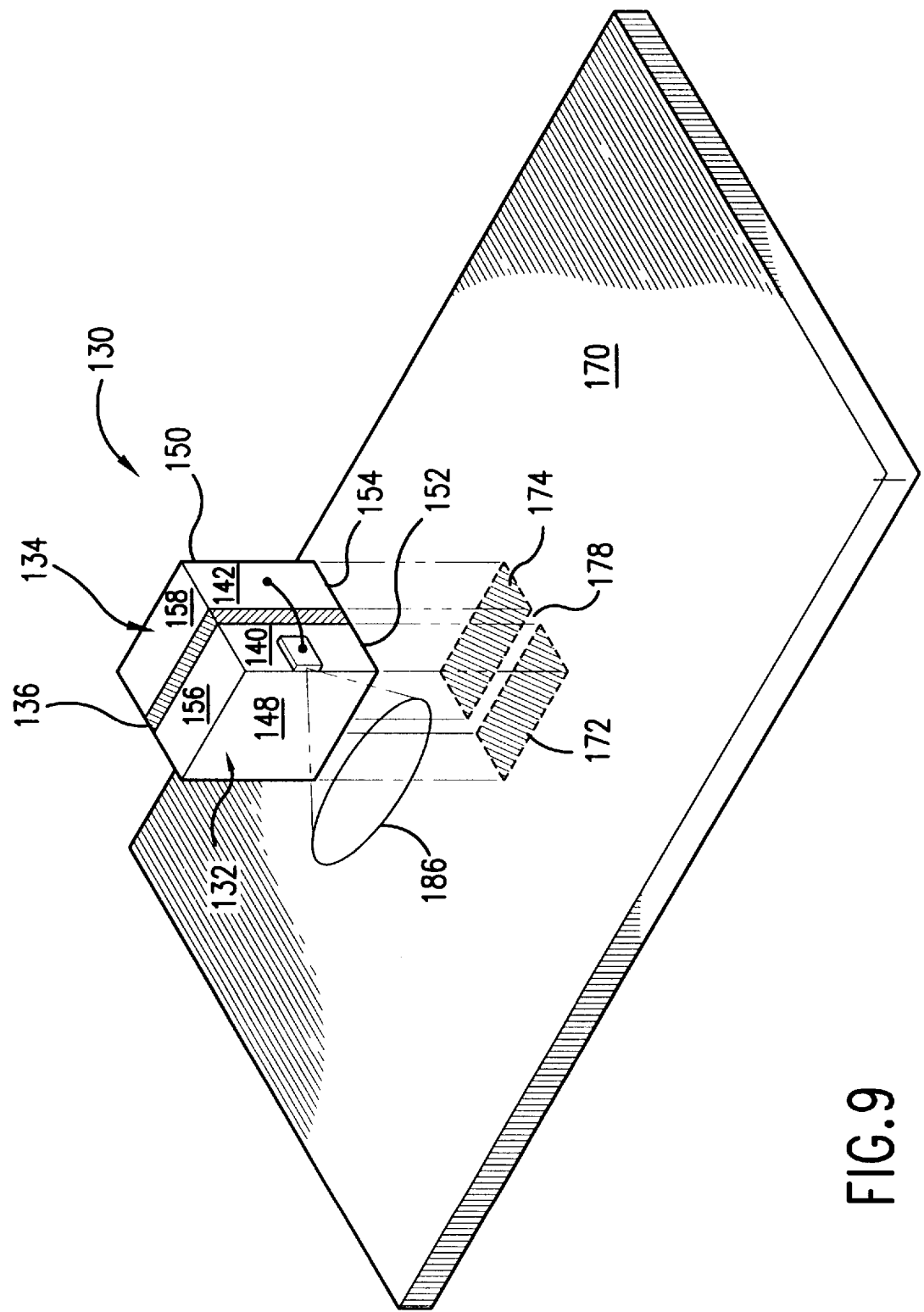
FIG. 9 is a perspective view of the device of FIG. 8 oriented at a different direction in use with the substrate.

FIGS. 8 and 9 illustrate a light emitting semiconductor device 130 according to a second embodiment of the present invention. The semiconductor device has two conductors 132 and 134 that are separated by an isolation mechanism 136, such as a dielectric material. The dielectric material 136 is preferably a thin strip of material sandwiched between the two conductors 132 and 134. Although the conductors 132 and 134 are illustrated as having substantially the same size and configuration, it is also possible to provide them in different sizes and configurations. The semiconductor device 130 therefore takes on a block configuration which generally resembles a cube in the preferred embodiment of the present invention.

The semiconductor device 130 also defines a number of surfaces. The top surface of the semiconductor device 130 is defined by a generally elongated first surface 140 of the first conductor 132 and a generally elongated first surface 142 of the second conductor 134. The bottom surface of the semiconductor device 130 is defined by a generally elongated second surface 144 of the first conductor 132 and a generally elongated second surface 146 of the second conductor 134. The semiconductor device 30 has four side surfaces that define the cubic configuration between and adjacent the top and bottom surfaces. These four side surfaces are defined by (1) a square or rectangular third surface 148 of the first conductor 132, (2) a square or rectangular third surface 150 of the second conductor 134 opposite the third surface 148 of the first conductor 132, (3) a generally elongated fourth surface 152 of the first conductor 132 (adjacent the third surface 148 of the first conductor 132) and a generally elongated fourth surface 154 of the second conductor 134 (adjacent the third surface 150 of the second conductor 134), and (4) a generally elongated fifth surface 156 of the first conductor 132 (adjacent the third surface 148 of the first conductor 132) and an elongated fifth surface 158 of the second conductor 134 (adjacent the third surface 150 of the second conductor 134). The dielectric material 136 separates the conductors 132 and 134 (1) along the top and bottom surfaces of the semiconductor device 130, (2) between the fourth surface 152 of the first conductor 132 and the fourth surface 154 of the second conductor 134, and (3) between the fifth surface 156 of the first conductor 132 and the fifth surface 158 of the second conductor 134.

A light emitting element 160 is disposed on the first surface 140 of the first conductor 132 adjacent the edge 162 between the first surface 140 and the third surface 148 of the first conductor 132. Like the light emitting element 60, the light emitting element 160 is preferably disposed at a central portion of the edge 162, although the light emitting element 160 can also be positioned anywhere along the edge 162. Each such different position along the edge 162 would provide a different direction for the light beam emitted from the light emitting element 160. The light emitting element 160 is also preferably a semiconductor laser diode. The light emitting element 160 is connected to the first surface 140 by the same methods described above for the light emitting element 60. The light emitting element 160 is electrically connected to the second conductor 134 by a wire 164.

Referring now to FIG. 8, the semiconductor device 130 is positioned on a substrate 170 in a manner such that the bottom surface of the semiconductor device 130 (i.e., second surfaces 144 and 146 of the first and second conductors 132, 134, respectively) is positioned against the substrate 170. Electrical connectors 172 and 174, such as conductor pads, are connected to the second surfaces 144 and 146, respectively. Connectors 172 and 174 are elongated to match the elongated configuration of the surfaces 144 and 146. An elongated space 178 separates the connectors 172 and 174 on the substrate 170. When positioned in the manner shown in FIG. 8, the light emitting element 160 emits a beam of light 176 that extends to the left of the semiconductor device 130.

Referring now to FIG. 9, the semiconductor device 130 can be positioned on the same substrate 170 in a manner such that the fourth surfaces 152 and 154 of the first and second conductors 132 and 134, respectively, are positioned against the substrate 170 and the connectors 172 and 174, respectively. When positioned in the manner shown in FIG. 9, the light emitting element 160 emits a beam of light 186 that extends to the left of the semiconductor device 130, but at an orientation that is different from the light beam 176 in FIG. 8. As explained above in connection with light beams 76 and 96, the different orientations are due to the different orientations of the long elements of the elliptical light beams 176, 186.

Although not illustrated, it is also possible to position the semiconductor device 130 on substrate 170 in a manner such that the fifth surfaces 156 and 158 of the first and second conductors 132 and 134, respectively, are positioned against the pads 172, 174, respectively, of the substrate 170. In addition, different substrates having differently sized and configured connector pads can be provided in place of the substrate 170 and its pads 172, 174.

Thus, the semiconductor device 130 similarly provides a light emitting element 160 that can emit light beams in three different directions or orientations, depending on the position at which the semiconductor device 130 is connected to the substrate 170. Again, any surface of the semiconductor device 130 where the dielectric material 136 separates two surfaces, one from the first conductor 132 and one from the second conductor 134, can be electrically connected to the substrate. Of the six different surfaces of the semiconductor device 130, only three surfaces are not available for electrical connection to the substrate: third surfaces 148 and 150, and the top surface (made up of the first surfaces 140 and 142 of the first and second conductors 132 and 134, respectively) where the light emitting element 160 is disposed. The three surfaces that are available for electrical connection to the substrate have been illustrated in FIGS. 8–9 and described above. As illustrated, the same substrate 170 having the same pads 172 and 174 can be used to accomodate the semiconductor device 130 in any of its three positions.

Figure 10:
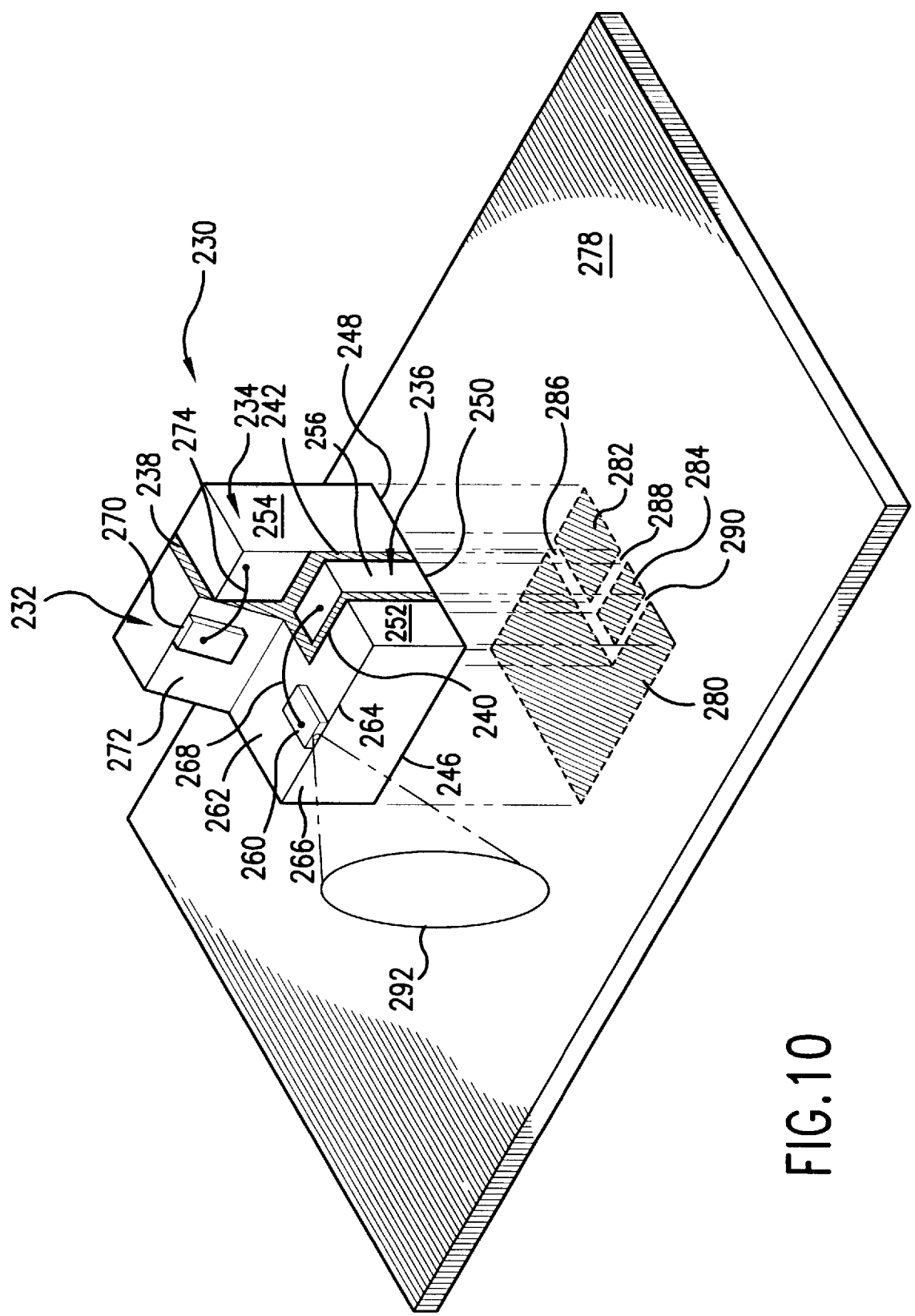
FIG. 10 perspective view of a light emitting semiconductor device according to a third embodiment of the present invention shown in use with a substrate.
Figure 11:
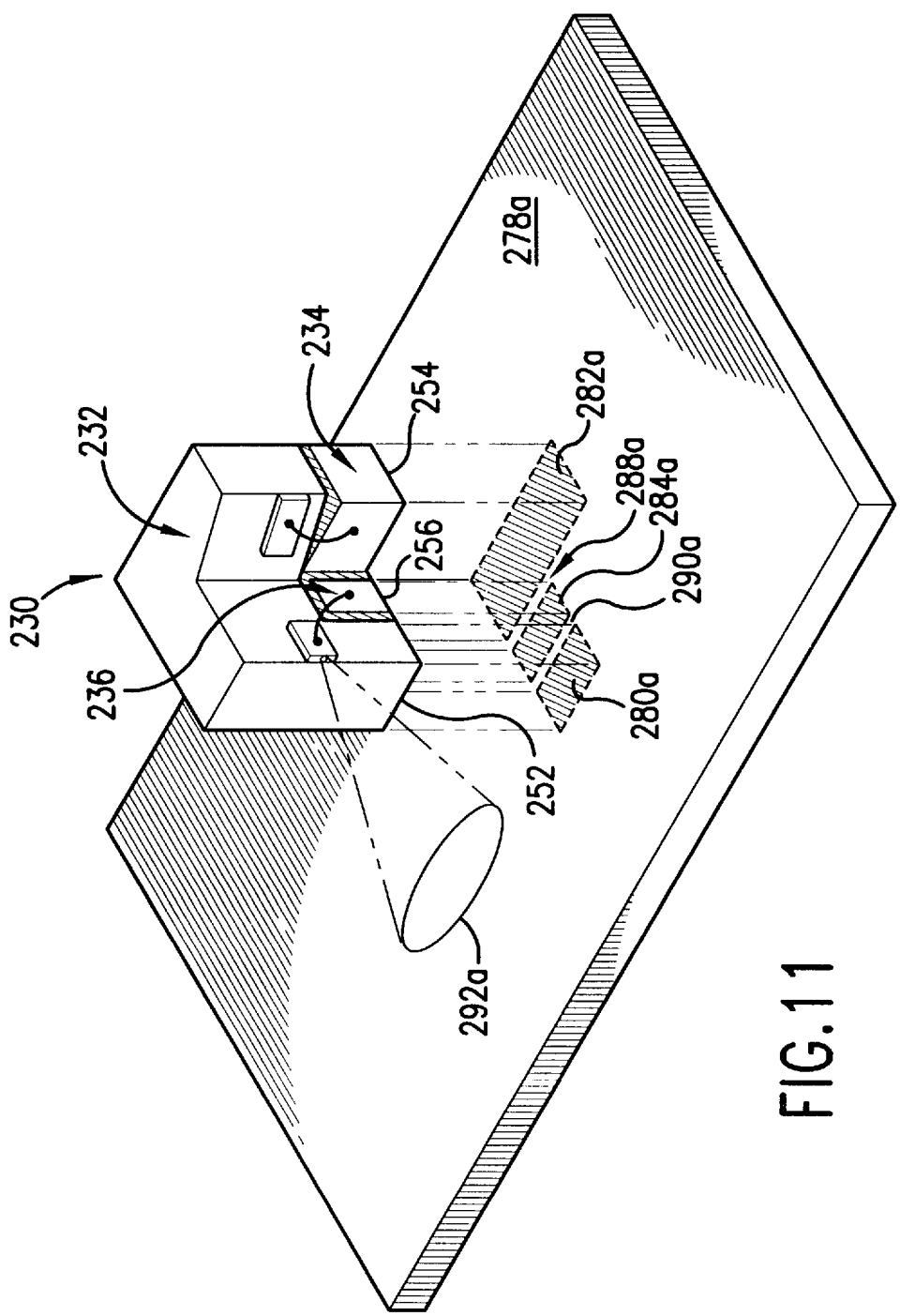
FIG. 11 is a perspective view of the device of FIG. 10 oriented at a different direction in use with another substrate.

The present invention also provides semiconductor devices having more than two conductors. FIGS. 10 and 11 illustrate a light emitting semiconductor device 230 according to a third embodiment of the present invention having three conductors. Specifically, the semiconductor device has three conductors 232, 234 and 236 that are separated by isolation mechanisms 238, 240 and 242, which can each be a thin strip of dielectric material. The dielectric material 238 is used to separate the conductor 232 from the conductors 234 and 236, the dielectric material 240 separates the conductors 232 and 236, and the dielectric material 242 separates the conductors 234 and 236, so that the combined dielectric materials 238, 240, 242 assume a "F"-shaped configuration. Conductor 232 is generally configured as a three-dimensional L-shaped block, while conductors 234 and 236 are generally configured as square or rectangular blocks.

The semiconductor device 230 also defines a number of surfaces. The bottom surface of the semiconductor device 230 is defined by a generally L-shaped first surface 246 of the first conductor 232, a generally square or rectangular first surface 248 of the second conductor 234, and a generally square or rectangular first surface 250 of the third conductor 236. The right surface of the semiconductor device 230 is defined by a generally square or rectangular second surface 252 of the first conductor 232, a generally square or rectangular second surface 254 of the second conductor 234, and a generally square or rectangular second surface 256 of the third conductor 236. These are the only two surfaces of the semiconductor device 230 that include at least one surface from each conductor 232, 234, 236.

A light emitting element 260 is disposed on a first top surface 262 of the first conductor 232 adjacent an edge 264 between the first top surface 262 and a front surface 266 of the first conductor 232. Like the light emitting element 60, the light emitting element 260 is preferably disposed at a central portion of the edge 264, although the light emitting element 260 can also be positioned anywhere along the edge 264. Each such different position along the edge 264 would provide a different direction for the light beam emitted from the light emitting element 160. The light emitting element 260 is also preferably a semiconductor laser diode. The light emitting element 260 is connected to the first top surface 262 by the same methods described above for the light emitting element 60. The light emitting element 260 is electrically connected to the third conductor 236 by a wire 268. In addition, a light receiving element 270, such as but not limited to a PIN photodiode, is disposed on a second top surface 272 of the first conductor 232 and is electrically connected to the second conductor 234 by another wire 274.

Referring now to FIG. 10, the semiconductor device 230 is positioned on a substrate 278 in a manner such that the bottom surface of the semiconductor device 230 (i.e., first surfaces 246, 248 and 250 of the first, second and third conductors 232, 234 and 236, respectively) is positioned against the substrate 278. Electrical connectors 280, 282 and 284, such as conductor pads, are connected to the first surfaces 246, 248 and 250, respectively. The connectors 280, 282, 284 are configured to match the configurations of the first surfaces 246, 248 and 250, respectively. Elongated spaces 286, 288 and 290 separate the connectors 280, 282 and 284 on the substrate 278. When positioned in the manner shown in FIG. 10, the light emitting element 260 emits a beam of light 292 that extends to the front of the semiconductor device 230.

Referring now to FIG. 11, the semiconductor device 230 is positioned on a substrate 278a in a manner such that the second surfaces 252, 254, 256 of the first, second and third conductors 232, 234 and 236, respectively, are positioned against another substrate 278a. Conductor pads or connectors 280a, 282a and 284a are connected to the second surfaces 252, 254 and 256, respectively. The connectors 280a, 282a, 284a are again configured to match the configurations of the second surfaces 252, 254, 256, respectively. Elongated spaces 288a and 290a separate the connectors 280a, 282a and 284a on the substrate 278a. When positioned in the manner shown in FIG. 11, the light emitting element 260 emits a beam of light 292a that extends to the front of the semiconductor device 230, but at an orientation that is different from the light beam 292 in FIG. 10. As explained above in connection with light beams 76 and 96, the different orientations are due to the different orientations of the long elements of the elliptical light beams 292, 292a.

Thus, the semiconductor device 230 similarly provides a light emitting element 260 that can emit light beams in two different directions or orientations, depending on the position at which the semiconductor device 230 is connected to the substrate 278 or 278a. In effect, any surface of the semiconductor device 230 where dielectric material separates the surfaces of the three conductors can be electrically connected to the substrate. Of the different surfaces of the semiconductor device 230, only the bottom and right surfaces described above are available for electrical connection to the substrate.

Figure 12:
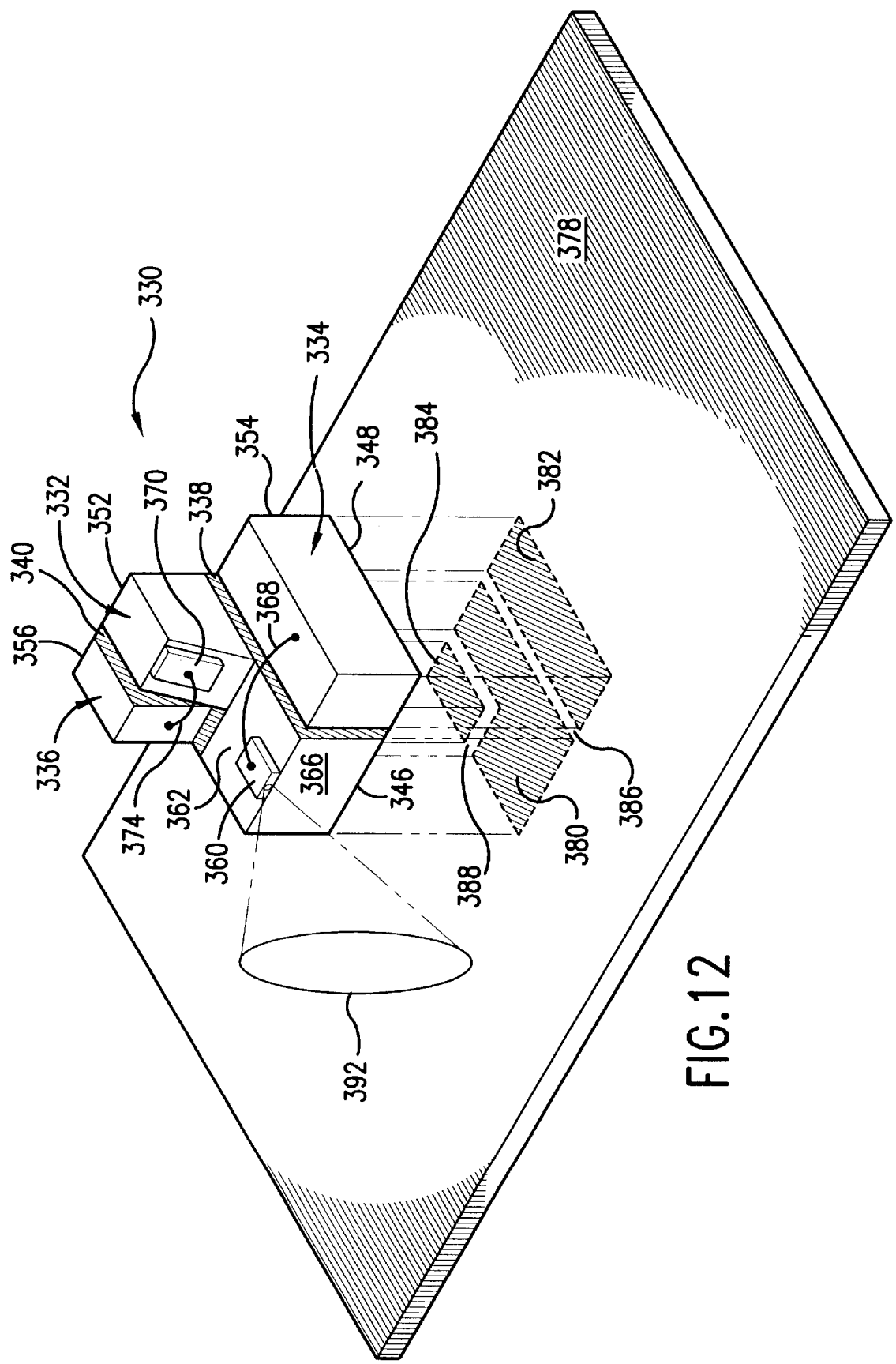
FIG. 12 perspective view of a light emitting semiconductor device according to a fourth embodiment of the present invention shown in use with a substrate.
Figure 13:
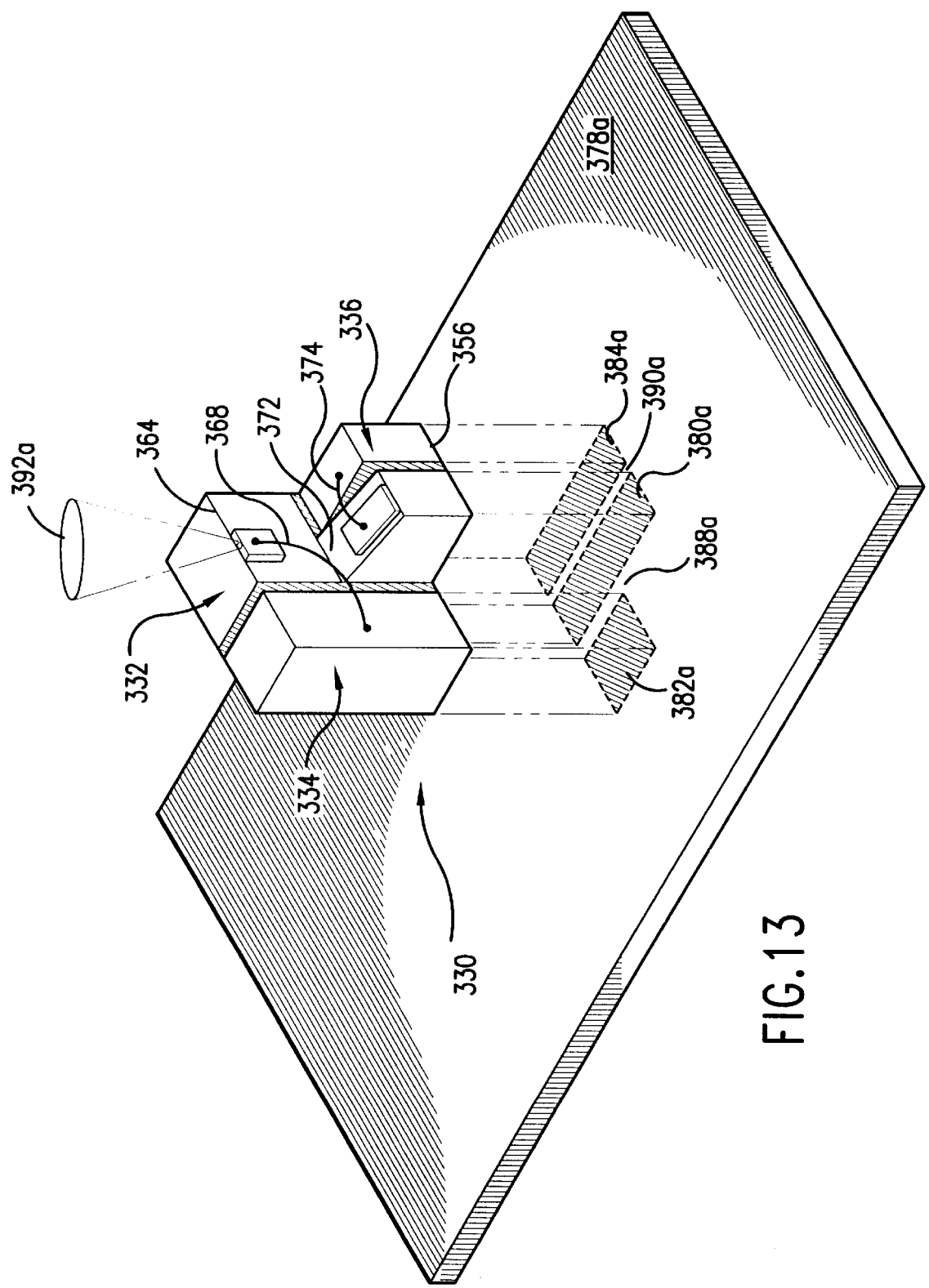
FIG. 13 is a perspective view of the device of FIG. 12 oriented at a different direction in use with another substrate.

FIGS. 12 and 13 illustrate a light emitting semiconductor device 330 according to a fourth embodiment of the present invention, also having three conductors. Specifically, the semiconductor device has three conductors 332, 334 and 336 that are separated by isolation mechanisms 338 and 340, which can each be a thin strip of dielectric material. The dielectric material 338 is generally elongated and separates the conductors 332 and 334, and the dielectric material 340 is generally L-shaped and separates the conductors 332 and 336. Conductor 332 is generally configured as a three-dimensional L-shaped block, while conductors 334 and 336 are generally configured as square or rectangular blocks.

The semiconductor device 330 also defines a number of surfaces. The bottom surface of the semiconductor device 330 is defined by a generally L-shaped first surface 346 of the first conductor 332, a generally square or rectangular first surface 348 of the second conductor 334, and a generally square or rectangular first surface 350 (not shown in the drawings) of the third conductor 336. The rear surface of the semiconductor device 330 is defined by a generally square or rectangular second surface 352 of the first conductor 332, a generally square or rectangular second surface 354 of the second conductor 334, and a generally square or rectangular second surface 356 of the third conductor 336. These are the only two surfaces of the semiconductor device 330 that include at least one surface from each conductor 332, 334, 336.

A light emitting element 360 is disposed on a first top surface 362 of the first conductor 332 adjacent an edge 364 between the first top surface 362 and a front surface 366 of the first conductor 332. The light emitting element 360 is also preferably a semiconductor laser diode. The light emitting element 360 is connected to the first top surface 362 by the same methods described above for the light emitting element 60. The light emitting element 360 is electrically connected to the second conductor 334 by a wire 368. In addition, a light receiving element 370, such as but not limited to a PIN photodiode, is disposed on a second top surface 372 of the first conductor 332 and is electrically connected to the third conductor 336 by another wire 374.

Referring now to FIG. 12, the semiconductor device 330 is positioned on a substrate 378 in a manner such that the bottom surface of the semiconductor device 330 (i.e., first surfaces 346, 348 and 350 of the first, second and third conductors 332, 334 and 336, respectively) is positioned against the substrate 378. Electrical connectors 380, 382 and 384, such as conductor pads, are connected to the first surfaces 346, 348 and 350, respectively. The connectors 380, 382, 384 are configured to match the configurations of the first surfaces 346, 348 and 350, respectively. An elongated space 386 separates connectors 380 and 382, and an L-shaped space 388 separates connectors 380 and 384 on the substrate 378. When positioned in the manner shown in FIG. 12, the light emitting element 360 emits a beam of light 392 that extends to the front of the semiconductor device 330.

Referring now to FIG. 13, the semiconductor device 330 is positioned on a substrate 378a in a manner such that the second surfaces 352, 354, 356 of the first, second and third conductors 332, 334 and 336, respectively, are positioned against the substrate 378a. Conductor pads or connectors 380a, 382a and 384a are connected to the second surfaces 352, 354 and 356, respectively. The connectors 380a, 382a, 384a are again configured to match the configurations of the second surfaces 352, 354, 356, respectively. Elongated space 388a separates connectors 380a and 382a, and elongated space 390a separates connectors 380a and 384a on substrate 278a. When positioned in the manner shown in FIG. 13, the light emitting element 360 emits a beam of light 392a that extends to the top of the semiconductor device 330.

Thus, the semiconductor device 330 similarly provides a light emitting element 360 that can emit light beams in two different directions or orientations, depending on the position at which the semiconductor device 330 is connected to the substrate 378 or 378a. As with the device 230, any surface of the semiconductor device 330 where dielectric material separates the surfaces of the three conductors can be electrically connected to the substrate. Of the different surfaces of the semiconductor device 330, only the bottom and rear surfaces described above are available for electrical connection to the substrate.

The conductors 132, 134, 232, 234, 236, 332, 334 and 336 can be made from the same materials as conductors 32 and 34 described above. Similarly, the dielectric materials 136, 238, 240, 242, 338 and 340 can also be provided with the same materials and dimensions as the dielectric material 36 described above.

Although the light-emitting semiconductor devices 30, 130, 230 and 330 have been illustrated as having certain configurations, those skilled in the art will appreciate that the configuration of the semiconductor devices can be varied as long as they provide sufficient surfaces to adjust the position of the semiconductor devices and the direction and orientation of the resulting light beams. In addition, the configuration and size of the conductors 32, 34, 132, 134, 232, 234, 236, 332, 334 and 336, and their respective surfaces, can also be varied without departing from the spirit and scope of the present invention.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. In combination:
    a substrate; and
    a light-emitting semiconductor device, including:
        a. a first conductor having a first surface and a second surface;
        b. a second conductor having a first surface and a second surface;
        c. a first isolation material separating the first and second conductors;
        d. a light emitting element disposed on the first conductor;
        e. a first semiconductor surface including the first surfaces of the first and second conductors separated by the first isolation material; and
        f. a second semiconductor surface including the second surfaces of the first and second conductors separated by the first isolation material;
    wherein both the first semiconductor surface and the second semiconductor surface are electrically connected to the substrate.

2. The combination of claim 1, wherein the light emitting element emits a first light beam when the first semiconductor surface is connected to the substrate and the light emitting element emits a second light beam when the second semiconductor surface is connected to the substrate, with the first and second light beams having a different direction.

3. The combination of claim 2, wherein the first and second conductors each comprises a third surface, and wherein the semiconductor device further comprises a third semiconductor surface comprising the third surfaces of the first and second conductors separated by the first isolation material.

4. The combination of claim 3, wherein the light emitting element is disposed on the third surface of the first conductor.

5. The combination of claim 3, wherein the third semiconductor surface are electrically connected to the substrate, and wherein the first, second and third semiconductor surfaces are adjacent to each other.

6. The combination of claim 5, wherein the first surface of the first conductor has an L-shaped configuration, the second surface of the first and second conductors have elongated configurations, and the third surface of the first and second conductors have elongated configurations.

7. The combination of claim 3, wherein the first semiconductor surface is opposite the second semiconductor surface, and the third semiconductor surface is adjacent the first and second semiconductor surfaces.

8. The combination of claim 7, wherein the first, second and third surfaces of the first and second conductors have elongated configurations.

9. The combination of claim 2, wherein the first semiconductor surface is adjacent to the second semiconductor surface.

10. The combination of claim 2, wherein the first semiconductor surface is opposite the second semiconductor surface.

11. The combination of claim 2, wherein the substrate comprises means for connecting a semiconductor surface to the substrate.

12. The combination of claim 2:
    wherein the light-emitting semiconductor device further includes a third conductor having a first and a second surface, and a second isolation material;
    wherein the first semiconductor surface includes the first surfaces of the first, second and third conductors separated by the first and second isolation materials; and
    wherein the second semiconductor surface includes the second surfaces of the first, second and third conductors separated by the first and second isolation materials.

13. The combination of claim 12, wherein the first semiconductor surface is adjacent to the second semiconductor surface.

14. The combination of claim 12, wherein the second isolation material includes a first dielectric material separating the first conductor and the second and third conductors, a second dielectric material separating the second and third conductors, and a third dielectric material separating the first and third conductors.

15. The combination of claim 12, wherein the second isolation material includes a first dielectric material separating the first and second conductors, and a second dielectric material separating the first and third conductors.

16. A light-emitting semiconductor device, comprising:
    a. a first conductor having a first and a second surface;
    b. a second conductor having a first and a second surface;
    c. a first isolation material separating the first and second conductors;
    d. a light emitting element disposed on the first conductor;
    e. a first semiconductor surface including the first surfaces of the first and second conductors separated by the first isolation material; and
    f. a second semiconductor surface including the second surfaces of the first and second conductors separated by the first isolation material, wherein the first semiconductor surface is adjacent to the second semiconductor surface.

17. A light-emitting semiconductor device, comprising:
    a. a first conductor having a first, a second, and a third surface;
    b. a second conductor having a first, a second, and a third surface;
    c. a first isolation material separating the first and second conductors;
    d. a light emitting element disposed on the first conductor;
    e. a first semiconductor surface including the first surfaces of the first and second conductors separated by the first isolation material; and
    f. a second semiconductor surface including the second surfaces of the first and second conductors separated by the first isolation material, wherein the semiconductor device further comprises a third semiconductor surface comprising the third surfaces of the first and second conductors separated by the first isolation material.

18. The device of claim 17, wherein the first, second and third semiconductor surfaces are adjacent to each other.

* * * * *